United States Patent
Onate et al.

(10) Patent No.: US 7,558,045 B1
(45) Date of Patent: Jul. 7, 2009

(54) ELECTROSTATIC CHUCK ASSEMBLY WITH CAPACITIVE SENSE FEATURE, AND RELATED OPERATING METHOD

(75) Inventors: Jaime Onate, Fremont, CA (US); Michael Kilgore, Sunnyvale, CA (US); Jimmy Lam, Fremont, CA (US); Timothy W. Kueper, Santa Clara, CA (US); Dan Ye, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/052,395

(22) Filed: Mar. 20, 2008

(51) Int. Cl.
*H01L 21/683* (2006.01)
(52) U.S. Cl. .................................... 361/234
(58) Field of Classification Search ................ 361/234, 361/230, 235; 279/128
See application file for complete search history.

(56) References Cited

U.S. PATENT DOCUMENTS

| | | | |
|---|---|---|---|
| 5,103,367 A * | 4/1992 | Horwitz et al. | 361/234 |
| 5,530,616 A * | 6/1996 | Kitabayashi et al. | 361/234 |
| 5,620,525 A | 4/1997 | van de Ven et al. | |
| 5,670,066 A * | 9/1997 | Barnes et al. | 219/121.58 |
| 5,948,986 A * | 9/1999 | Brown | 73/630 |
| 6,430,022 B2 * | 8/2002 | Leeser | 361/234 |
| 6,572,708 B2 | 6/2003 | Gujer et al. | |
| 6,938,505 B2 * | 9/2005 | Chen et al. | 73/865.9 |
| 7,154,731 B1 | 12/2006 | Kueper | |
| 7,292,428 B2 | 11/2007 | Hanawa et al. | |

* cited by examiner

*Primary Examiner*—Stephen W Jackson
*Assistant Examiner*—Terrence R Willoughby
(74) *Attorney, Agent, or Firm*—Ingrassia Fisher & Lorenz, P.C.

(57) ABSTRACT

A semiconductor workpiece processing system for treating a workpiece, such as a semiconductor wafer, is provided. A related operating control method is also provided. The system includes an electrostatic chuck configured to receive a workpiece, and a clamping voltage power supply coupled to the electrostatic chuck. The electrostatic chuck has a clamping electrode assembly, and the clamping voltage power supply is coupled to the clamping electrode assembly. The clamping voltage power supply includes a direct current (DC) voltage generator configured to generate a DC clamping voltage for the clamping electrode assembly, an alternating current (AC) voltage generator configured to generate an AC excitation signal for the clamping electrode assembly, and a processing architecture coupled to the clamping electrode assembly. The processing architecture is configured to analyze attributes of a workpiece presence signal obtained in response to the AC excitation signal, and, based on the attributes, verify proper/improper positioning of the workpiece relative to the electrostatic chuck.

30 Claims, 6 Drawing Sheets

ELECTROSTATIC CHUCK ASSEMBLY WITH CAPACITIVE SENSE FEATURE, AND RELATED OPERATING METHOD

TECHNICAL FIELD

Embodiments of the subject matter described herein relate generally to workpiece processing. More particularly, embodiments of the subject matter relate to detecting processing status conditions of a workpiece, such as a semiconductor wafer, during processing and handling by a semiconductor workpiece processing system, such as a chemical vapor deposition system.

BACKGROUND

Electrostatic chucks are employed to support wafers in a variety of semiconductor workpiece processing systems. In a deposition system, for example, an electrostatic chuck may be used to clamp a wafer in place while a thin film is deposited on the wafer. In an etch system, as another example, an electrostatic chuck may be used to clamp a wafer in place while material is being chemically etched from the wafer. These systems typically comprise a reaction chamber, a vacuum pumping system for removing gases from the chamber, a reactant delivery system for conveying chemical reactants to the chamber, and a workpiece support system for holding the workpiece in place during processing.

A typical workpiece support system employs a platen that supports the workpiece during processing. Some systems also utilize electrostatic chucks, which use electrostatic force to hold the workpiece in place. An electrostatic chuck has electrodes that are energized with a clamping voltage, which electrostatically clamps the wafer to the surface of the electrostatic chuck. The electrodes in the electrostatic chuck are coupled to an electrostatic power supply and a controller. The electrostatic power supply receives the control signal from the controller and generates a clamping voltage adapted to clamp the substrate with a clamping force.

Before the process begins, a wafer is transferred into the reaction chamber and is typically placed on lift pins that support the wafer prior to loading onto the electrostatic chuck. The lift pins are then lowered (and/or the electrostatic chuck is raised) such that the wafer rests on the upper surface of the electrostatic chuck rather than on the lift pins. At this time, clamping voltage is applied to the electrostatic chuck to clamp the wafer in preparation of the process. After completion of the process, the clamping voltage is removed to release the wafer from the electrostatic chuck, and the lift pins are engaged to lift the wafer above the surface of the electrostatic chuck. Thereafter, the treated wafer can be removed from the lift pins using a transport mechanism.

Proper positioning of the wafer relative to the electrostatic chuck is important at various times before, during, and after typical semiconductor workpiece processes. For example, it is important to ensure that the wafer is properly loaded onto the electrostatic chuck before applying the clamping voltage. As another example, it may be desirable to determine whether the wafer is clamped or unclamped at certain times. As yet another example, it can be important to ensure that the wafer is properly positioned on the lift pins before proceeding further in the processing cycle.

BRIEF SUMMARY

An electrostatic chuck assembly suitable for use in a semiconductor workpiece processing system and related operating methods are provided. The electrostatic chuck assembly includes a capacitive sensor subsystem that is incorporated into the clamping voltage power supply of the electrostatic chuck. The capacitive sensor subsystem applies an excitation signal to the clamping electrodes of the electrostatic chuck, and determines wafer status conditions in response to the excitation signal. In particular, changes in capacitance between the wafer and the electrostatic chuck (which correspond to changes in the position of the wafer relative to the upper surface of the electrostatic chuck) result in detectable attributes in a workpiece presence signal that is derived from the excitation signal. The capacitive sensor subsystem detects and analyzes these attributes before, during, and/or after the process to verify proper positioning of the wafer relative to the electrostatic chuck.

The above and other aspects may be found in an embodiment of an electrostatic chuck assembly having: a platen configured to receive a workpiece, an electrostatic chuck, an electrode assembly for the chuck, the electrode assembly being configured to receive a direct current (DC) clamping voltage to electrostatically adhere the workpiece to the chuck; and a capacitive sensor subsystem coupled to the electrode assembly. The capacitive sensor subsystem is configured to generate an alternating current (AC) excitation signal for the electrode assembly, and analyze electrical characteristics of the excitation signal that are influenced by changes in capacitance between the workpiece and the chuck.

The above and other aspects may be carried out by an embodiment of a method of controlling a semiconductor workpiece processing system, the system having an electrostatic chuck that holds the workpiece during processing. The method involves: applying an AC excitation signal to electrodes of the electrostatic chuck; obtaining a workpiece presence signal in response to the AC excitation signal, the workpiece presence signal being influenced by capacitance between the electrostatic chuck and the workpiece; identifying an attribute of the workpiece presence signal; and controlling operation of the system in a manner dictated by the attribute.

The above and other aspects may be carried out by an embodiment of a system having: an electrostatic chuck configured to receive a workpiece, the electrostatic chuck comprising a clamping electrode assembly; and a clamping voltage power supply coupled to the clamping electrode assembly. The clamping voltage power supply includes: a DC voltage generator configured to generate a DC clamping voltage for the clamping electrode assembly; an AC voltage generator configured to generate an AC excitation signal for the clamping electrode assembly; and a processing architecture coupled to the clamping electrode assembly. The processing architecture is configured to analyze attributes of a workpiece presence signal obtained in response to the AC excitation signal, and, based on the attributes, verify proper/improper positioning of the workpiece relative to the electrostatic chuck.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
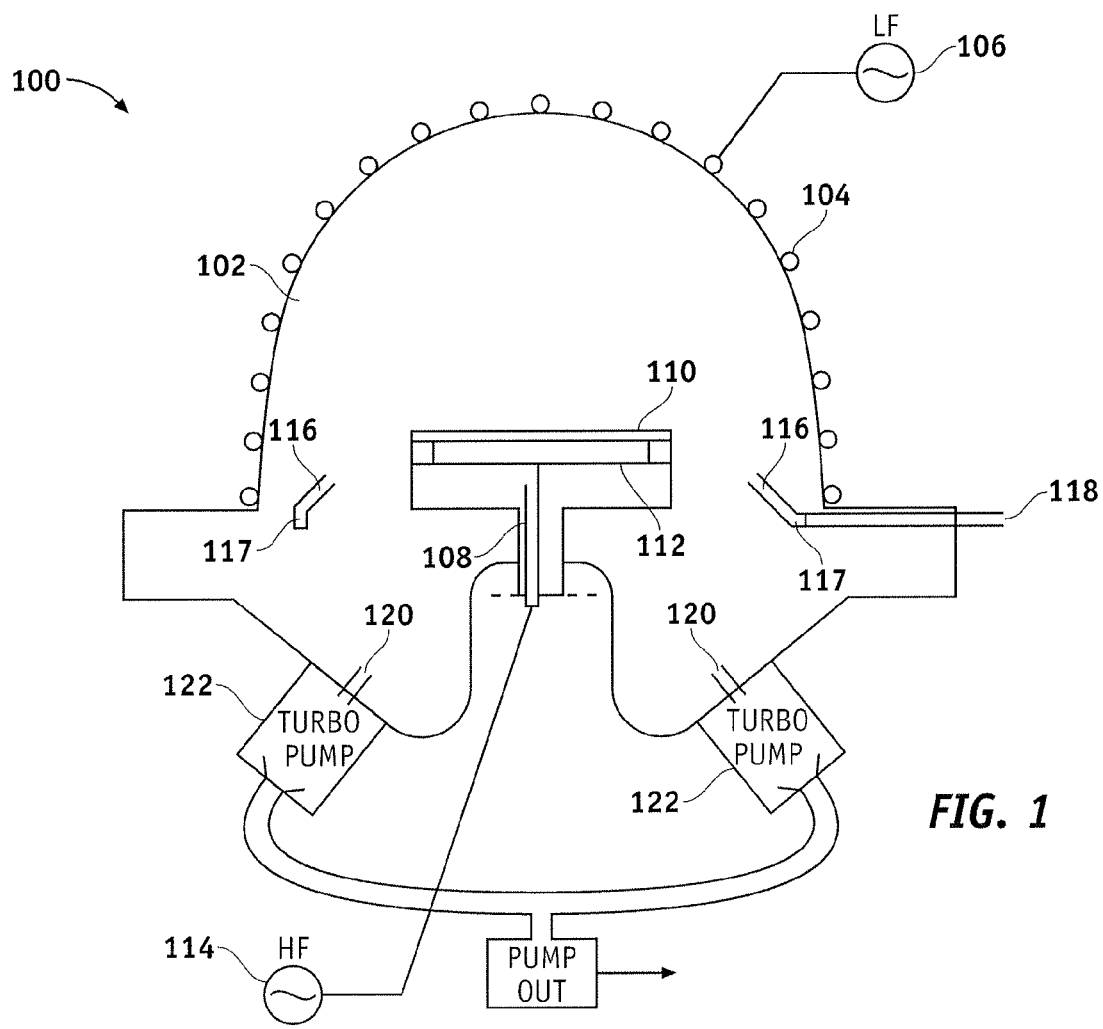
FIG. 1 is a schematic representation of an embodiment of a CVD system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard," and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

The embodiments described below may be enabled in any manner of semiconductor workpiece processing system utilizing an electrostatic chuck. The system may be one of a chemical vapor deposition (CVD), high density plasma CVD (HDP-CVD), plasma-enhanced CVD (PECVD), physical vapor deposition (PVD), atomic layer deposition (ALD), ion-enhanced ALD (iALD), resist strip, chemical etch, plasma etch, lithography or other semiconductor processing system.

FIG. 1 is a schematic representation of an embodiment of an HDP-CVD system 100. For the sake of brevity, conventional techniques related to semiconductor wafer processing, CVD processes, CVD systems and associated system components, capacitive sensors, and other functional aspects of the systems (and the individual operating components of the systems) may not be described in detail herein. HDP-CVD system 100 includes a process chamber 102 that encloses other components of HDP-CVD system 100 and serves to contain the plasma generated by an RF power source coupled to an induction coil 104, which surrounds process chamber 102 (on or embedded in the walls of process chamber 102). The walls of process chamber 102 may be formed of aluminum, aluminum oxide, and/or other suitable material. Induction coil 104 is powered by a low frequency RF source 106. The power and frequency supplied by RF source 106 is sufficient to generate high-density plasma from the process gas.

HDP-CVD system 100 includes a pedestal 108 that is configured to support a workpiece 110, such as a semiconductor wafer undergoing a HDP-CVD process. In this embodiment, pedestal 108 includes an electrostatic chuck 112 that holds workpiece 110 in place during the deposition reaction. As described in more detail below, electrostatic chuck 112 may cooperate with a capacitive sensor subsystem for purposes of detecting certain workpiece status conditions before, during, and/or after the HDP-CVD process. Moreover, electrostatic chuck 112 may be part of a suitably configured electrostatic chuck assembly as described herein.

A high frequency RF source 114 serves to electrically bias workpiece 110 and draw charged precursor species onto workpiece 110 for the deposition or etch reactions. Electrical energy from RF source 114 is coupled to workpiece 110 via an electrode or capacitive coupling, for example. Note that the bias applied to workpiece 110 need not be an RF bias. Other frequencies and DC bias may be used as well.

The process gases are introduced via one or more chamber inlets 116. The gases may or may not be premixed. Additional inlets may be present at any point in the process chamber. The process gases may include inert and reactive gases such as hydrogen, helium, argon, nitrogen, oxygen, or silane. Preferably, the process gases are introduced through a gas supply inlet mechanism. The gas or gas mixture may be introduced from a primary gas ring 117, which may or may not direct the gas toward the surface of workpiece 110. In this embodiment, one or more ring inlets 118 are connected to the primary gas ring 117 to supply gas or gas mixture into process chamber 102 via the chamber inlets 116. The sonic front caused by the gas entering process chamber 102 will itself cause the gas to rapidly disperse in all directions, including toward workpiece 110. The process gas exits process chamber 102 via one or more outlets 120. At least one vacuum pump (e.g., a turbomolecular pump) 122 typically draws the gas out and maintains a suitably low pressure within process chamber 102.

Figure 3:
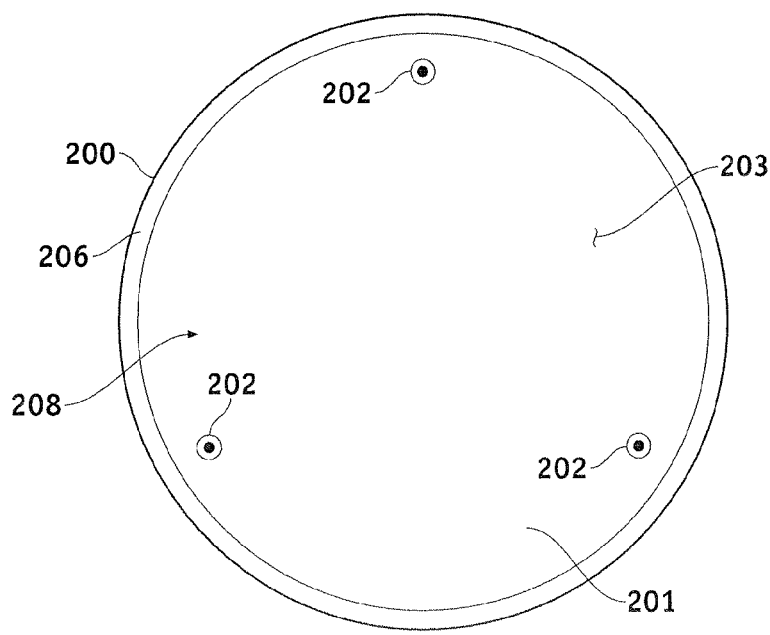
FIG. 3 is a top view of the electrostatic chuck shown in FIG. 2.
Figure 2:
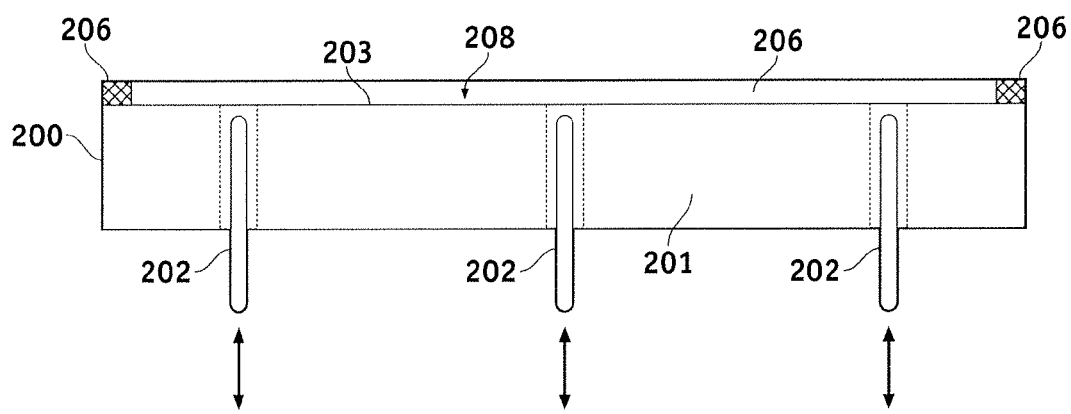
FIG. 2 is a cross sectional view of an embodiment of an electrostatic chuck, showing engagement of lift pins.

FIG. 2 is a simplified cross sectional view of an embodiment of an electrostatic chuck 200, showing engagement of lift pins 202, and FIG. 3 is a top view of electrostatic chuck 200. Electrostatic chuck 200 may be incorporated into a CVD system such as CVD system 100. In this embodiment, electrostatic chuck 200 cooperates with three lift pins 202, arranged approximately 120 degrees apart from one another in a triangular layout (see FIG. 3). Lift pins 202 are suitably configured and controlled to lift workpieces such as wafers above a platen 201 as needed. In certain embodiments, lift pins 202 are formed from a ceramic material, and their height positions relative to electrostatic chuck 200 are controlled by the host semiconductor workpiece processing system.

Figure 4:
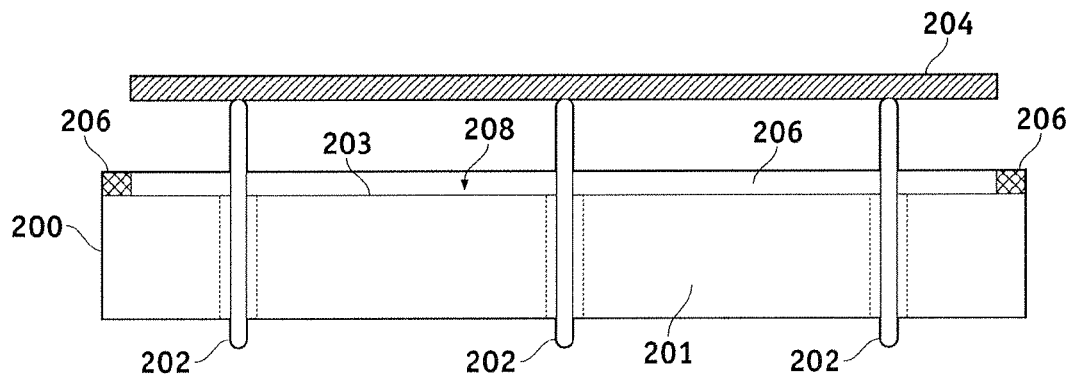
FIG. 4 is a cross sectional view of the electrostatic chuck shown in FIG. 2, showing proper placement of a wafer on lift pins.

Lift pins 202 are raised relative to electrostatic chuck 200 to accommodate placement and removal of wafers onto a platen 201 of electrostatic chuck 200, where platen 201 is suitably configured to receive the wafers. In this regard, FIG. 2 depicts lift pins 202 in a lowered position where the upper tips of lift pins 202 reside below an upper surface 203 of electrostatic chuck 200. FIG. 4 is a simplified cross sectional view of electrostatic chuck 200, showing proper placement of a wafer 204 on lift pins 202. FIG. 4 depicts lift pins 202 in a raised position where the upper tips of lift pins 202 reside above upper surface 203. While in this raised position, wafer 204 can be removed from lift pins 202 by a suitably configured transport arm of the host semiconductor workpiece processing system. As used herein, "proper" placement of a wafer on lift pins means that the wafer is resting on at least the minimum number of lift pins required for support of the wafer. For the illustrated embodiment, proper placement of wafer 204 is achieved when wafer 204 is resting on all three lift pins 202, as depicted in FIG. 4. Such proper placement results in a stable and flat positioning of wafer 204 above electrostatic chuck 200. In contrast, "improper" placement means that wafer 204 is not in contact with one or more lift pins 202. Such improper placement may cause wafer 204 to tilt or otherwise remain in an unstable position above electrostatic chuck 200.

Figure 5:
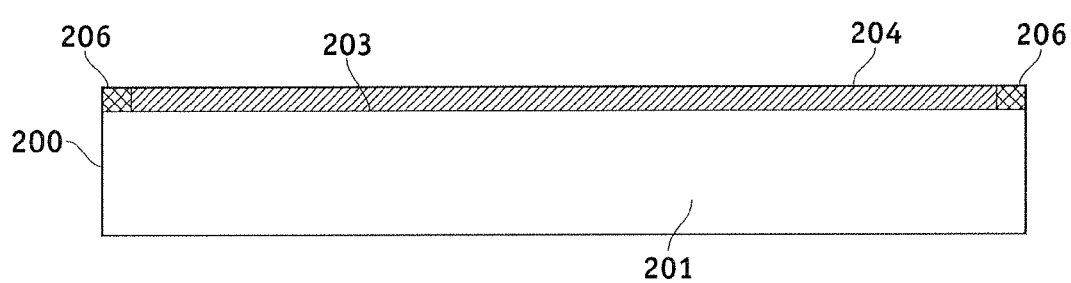
FIG. 5 is a cross sectional view of an embodiment of an electrostatic chuck, showing proper loading of a wafer.
Figure 6:
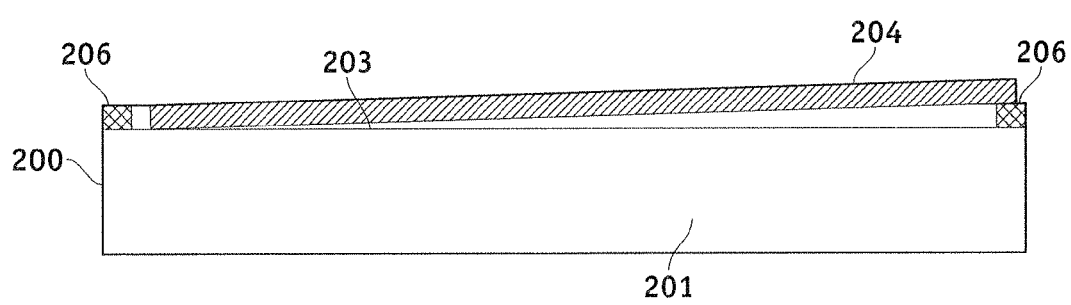
FIG. 6 is a cross sectional view of an embodiment of an electrostatic chuck, showing improper loading of a wafer.

FIG. 5 is a cross sectional view of electrostatic chuck 200, showing proper loading of wafer 204 on upper surface 203. This particular embodiment of electrostatic chuck 200 includes a guard ring 206 and a cavity 208 defined by guard ring 206 and upper surface 203. Guard ring 206 may be a separate element that is coupled to the body of electrostatic chuck 200, or it may be integrally formed into the body of electrostatic chuck 200. In certain embodiments, electrostatic chuck 200 and/or guard ring 206 are formed from a ceramic material. As shown in FIG. 3, guard ring 206 represents a circumferential boundary of cavity 208, which is shaped and sized to accommodate wafer 204. As used herein, "proper" loading of a wafer means that the wafer is positioned completely within cavity 208, as depicted in FIG. 5. In practice, proper loading in this manner is achieved before electrostatic chuck 200 is energized to clamp wafer 204 against upper surface 203. In contrast, "improper" loading of a wafer means that the wafer is not positioned completely within cavity 208. In this regard, FIG. 6 is a cross sectional view of electrostatic chuck 200, showing one condition that represents improper loading of wafer 204. Here, a portion of wafer 204 rests on guard ring 206, which results in tilting of wafer 204 relative to upper surface 203. As another example, wafer 204 is improperly loaded if it is skewed and completely resting on guard ring 206 (without touching upper surface 203). If electrostatic chuck 200 is energized with wafer 204 in an improperly loaded position, wafer 204 and/or electrostatic chuck 200 might be damaged. At the very least, the quality of the semiconductor workpiece process of an improperly loaded wafer 204 will be significantly compromised.

An embodiment of a semiconductor workpiece processing system as described herein employs an electrostatic chuck assembly, a clamping voltage power supply, capacitive sensing technology, and a suitably configured processing architecture to measure, detect, analyze, and/or verify certain conditions, status, or positioning of a wafer relative to the electrostatic chuck. For example, the system (in particular, the relevant processing architecture) can be suitably configured to verify proper/improper loading of a workpiece on the electrostatic chuck (as explained above with reference to FIGS. 2-6). As another example, the system (in particular, the relevant processing architecture) can be suitably configured to verify proper/improper placement of a workpiece on the plurality of lift pins (as explained above with reference to FIGS. 2-6). Moreover, the system (in particular, the relevant processing architecture) can be suitably configured to verify proper/improper clamping of a workpiece to the electrostatic chuck (as described in more detail below). In addition, the system can be suitably configured to perform a self-clamp recovery procedure that may be initiated when a wafer remains electrostatically clamped to the electrostatic chuck after removal of the normal clamping voltage. This self-clamp recovery procedure is described in more detail below.

Figure 7:
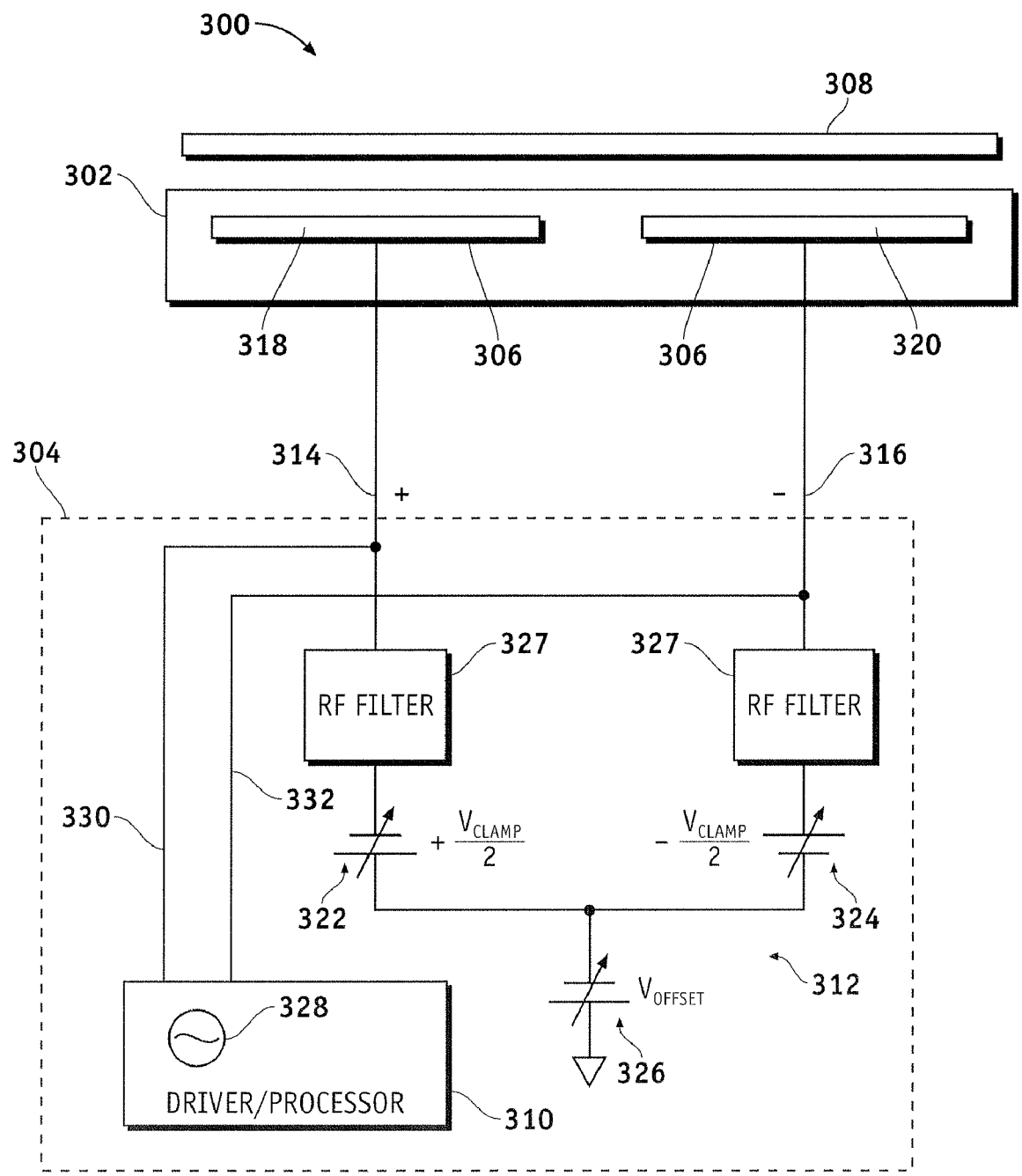
FIG. 7 is a schematic representation of an embodiment of an electrostatic chuck assembly having a capacitive sensor subsystem.

FIG. 7 is a schematic representation of an embodiment of an electrostatic chuck assembly 300 having a capacitive sensor subsystem. Electrostatic chuck assembly 300 generally includes, without limitation, an electrostatic chuck 302 and a clamping voltage power supply 304 coupled to electrostatic chuck 302. More specifically, electrostatic chuck 302 includes a clamping electrode assembly 306 for its platen, where clamping electrode assembly 306 is suitably configured to receive a direct current (DC) clamping voltage to electrostatically adhere a workpiece 308 (such as a semiconductor wafer) to electrostatic chuck 302. Moreover, the illustrated embodiment of clamping voltage power supply 304 includes a capacitive sensor driver and processor architecture 310, and a DC voltage generator 312.

Clamping voltage power supply 304 may be realized as an integrated subsystem of the host system, and FIG. 7 depicts a simplified embodiment for ease of description. This embodiment of clamping voltage power supply 304 has a positive voltage output node 314 and a negative voltage output node 316. Positive voltage output node 314 is coupled to one electrode 318 of clamping electrode assembly 306, and negative voltage output node 316 is coupled to another electrode 320 of clamping electrode assembly 306. DC voltage generator 312 is suitably configured to generate a DC clamping voltage for clamping electrode assembly 306, where the DC clamping voltage is applied via positive voltage output node 314 and negative voltage output node 316. An implementation of DC voltage generator 312 may employ an adjustable positive DC voltage source 322 and an adjustable negative DC voltage source 324, where positive DC voltage source 322 is controlled to generate an appropriate positive DC potential at positive voltage output node 314 and negative DC voltage source 324 is controlled to generate an appropriate negative DC potential at negative voltage output node 316. Clamping electrode assembly 306 responds to the relative voltage differential to establish the necessary electrostatic clamping force. In certain embodiments, DC voltage generator 312 may employ an adjustable DC offset voltage source 326 as shown in FIG. 7. Offset voltage source 326 is coupled to positive DC voltage source 322 and to negative DC voltage source 324, and offset voltage source 326 is configured to generate a DC offset potential for clamping electrode assembly 306.

Clamping voltage power supply 304 may also include one or more RF filters 327 located between output nodes 314/316 and DC voltage sources 322/324. RF filters 327 are suitably configured to filter high frequency voltage components that might otherwise enter clamping voltage power supply 304. In one particular embodiment, for example, RF filters 327 provide about 40 dBv of attenuation of 13.56 MHz and 400 kHz frequency components.

Capacitive sensor driver and processor architecture 310 may be implemented with any number of hardware, software, and/or firmware elements that are appropriately configured and arranged to carry out the functions and operations described here. For example, this particular embodiment of architecture 310 includes an AC voltage generator 328 that is configured to generate an AC excitation signal for clamping electrode assembly 306. In some embodiments, the AC excitation signal has a frequency of about 1 kHz and a peak-to-peak voltage of about 20 volts. In other embodiments, the frequency range for deposition and etch can be about 300 kHz to about 100 MHz. In one exemplary embodiment, a frequency of about 400 kHz is used for ion source, and a frequency of about 13.56 MHz is used for bias. Moreover, depending upon the actual process involved, the voltage can be within the range of about 100 Vrms to about 1100 Vrms.

As described in more detail below, the capacitive sensor subsystem utilizes the AC excitation signal to detect changes in capacitance between workpiece 308 and electrostatic chuck 302. This embodiment of AC voltage generator 328 cooperates with a positive AC voltage node 330 and a negative AC voltage node 332. In this embodiment, positive AC voltage node 330 is coupled to electrode 318 of clamping electrode assembly 306, and negative AC voltage node 332 is coupled to electrode 320 of clamping electrode assembly 306. Thus, AC voltage generator 328 applies the AC excitation signal to clamping electrode assembly 306 via positive AC voltage node 330 and negative AC voltage node 332. Under certain operating conditions, AC voltage generator 328 is configured to impress the AC excitation signal onto the DC clamping voltage generated by DC voltage generator 312. In other words, clamping electrode assembly 306 is concurrently subjected to the AC excitation signal and the DC clamping voltage. This enables the AC excitation signal to be applied for purposes of capacitive sensing before, during, and after electrostatic clamping of workpiece 308 to electrostatic chuck 302.

Capacitive sensor driver and processor architecture 310 can be configured and controlled to function as a capacitive sensor subsystem for electrostatic chuck assembly 300, where the capacitive sensor subsystem includes at least AC voltage generator 328 and a corresponding processing architecture that is able to analyze electrical characteristics of the AC excitation signal that are influenced by changes in capacitance between workpiece 308 and the platen of electrostatic chuck 302. In practice, the processing architecture utilized to support the capacitive sensor subsystem may be implemented or performed with a general purpose processor, a content addressable memory, a digital signal processor, an application specific integrated circuit, a field programmable gate array, any suitable programmable logic device, discrete gate or transistor logic, discrete hardware components, or any combination designed to perform the functions described here. A processor may be realized as a microprocessor, a controller, a microcontroller, or a state machine. Moreover, a processor may be implemented as a combination of computing devices, e.g., a combination of a digital signal processor and a microprocessor, a plurality of microprocessors, one or more microprocessors in conjunction with a digital signal processor core, or any other such configuration.

In response to the AC excitation signal, architecture 310 obtains and analyzes certain attributes of a workpiece presence signal. As used herein, an "attribute" of a workpiece presence signal is any measurable, detectable, calculable, or observable feature, value, trend, slope, characteristic, waveform, shape, or pattern of the workpiece presence signal. Examples of such attributes include, without limitation: a particular voltage level; a local or global minima or maxima; an abrupt rise or fall in the signal; a change in the rising or falling slope in the signal; or the like. An embodiment of the system described herein may utilize waveform analysis, signal processing, averaging, and/or comparison techniques to analyze, detect, and identify certain attributes of interest.

Based on certain detected attributes of the workpiece presence signal, architecture 310 can verify proper or improper positioning of workpiece 308 relative to electrostatic chuck 302 and/or lift pins 202. Such verification is possible because electrical characteristics of the workpiece presence signal are influenced by changes in capacitance between workpiece 308 and electrostatic chuck 302, and because such capacitance varies with the positioning of workpiece 308 relative to electrostatic chuck 302. As described further below, architecture 310 may be configured to detect workpiece status attributes of the workpiece presence signal and, in response to detected workpiece status attributes, control operation of the host semiconductor workpiece processing system. A workpiece status attribute may indicate, without limitation: whether workpiece 308 is properly or improperly loaded on the platen of electrostatic chuck 302; whether workpiece 308 is properly clamped or unclamped to the platen; whether workpiece is resting properly or improperly on the lift pins.

In operation, AC voltage generator 328 produces the AC excitation signal, which is applied to clamping electrode assembly 306. Capacitive currents generated by the 1 kHz, 20 volt peak-to-peak excitation signal are interpreted as wafer capacitance. The capacitance current in the circuit changes when the wafer is physically separated from the surface of the chuck. Architecture 310 monitors the workpiece presence signal, which has voltage characteristics that vary with the capacitance between workpiece 308 and electrostatic chuck 302. In one practical embodiment, the capacitance is measured on a scale of zero to ten volts, based on 1.8 V/nF. An embodiment of architecture 310 may process (e.g., translate, encode, and/or amplify) the raw sense data to obtain a workpiece presence signal having voltage characteristics that are compatible with the hardware, software, and processing logic of architecture 310. At specified times before, during, and after processing of a workpiece, the workpiece presence signal is analyzed for certain attributes, traits, and/or characteristics, such as voltage levels. Then, architecture 310 can compare the detected attributes to corresponding threshold values, calibrated values, or expected values to determine or verify whether or not the positioning of workpiece 308 relative to electrostatic chuck 302 (as indicated by the measured capacitance) is proper for that particular time. In practice, electrostatic chuck assembly 300 can perform workpiece positioning checks at various times throughout a processing cycle.

Figure 8:
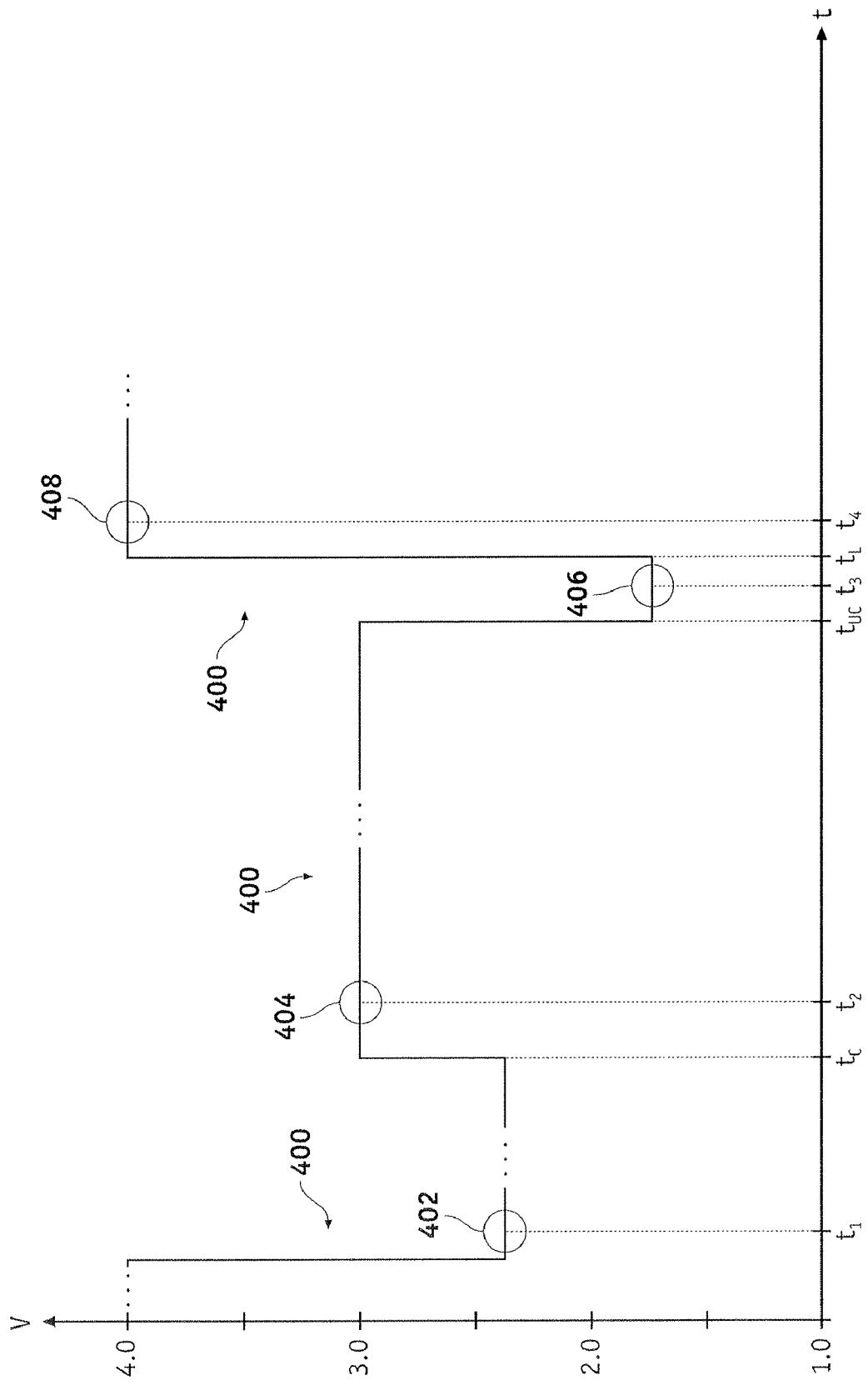
FIG. 8 is a graph of an exemplary workpiece presence signal obtained from a capacitance sensor subsystem of a semiconductor workpiece processing system during processing of a workpiece.

FIG. 8 is a graph of an exemplary workpiece presence signal 400 obtained from a capacitance sensor subsystem of a CVD system during processing of a workpiece. It should be appreciated that workpiece presence signal 400 represents only one possible sensor output, and that signals having different traits, characteristics, voltage levels, and timing can be produced and monitored by a CVD system that implements an electrostatic chuck assembly as described herein. Moreover, the particular characteristics of a workpiece presence signal will be influenced by the specific semiconductor workpiece processing system, the selected process recipe, and other practical factors.

For ease of description, workpiece presence signal 400 depicted in FIG. 8 represents a normal and error-free CVD process cycle. The left side of FIG. 8 corresponds to the beginning of the CVD process cycle, when the wafer is present in the chamber but before the wafer is loaded onto the electrostatic chuck. At this time, the wafer should be positioned on the lift pins as shown in FIG. 4. Plasma is present in the space between the wafer and the electrostatic chuck. The plasma serves as a very good electrical conductor and, therefore, the capacitance between the wafer and the electrostatic chuck is very low under this condition. Accordingly, workpiece presence signal 400 is relatively high (e.g., about 4.0 volts) before the wafer is loaded onto the chuck.

The first significant drop in workpiece presence signal 400 corresponds to the loading or placement of the wafer onto the upper surface of the electrostatic chuck. This is due to the lowering of the lift pins. At this point, the wafer should be positioned as depicted in FIG. 5—properly received within cavity 208 and not resting on guard ring 206. At or near time $t_1$, the capacitive sensor subsystem can verify proper/improper placement of the wafer on the electrostatic chuck by comparing the current voltage level of workpiece presence signal 400 to a given threshold voltage. In FIG. 8, the detected voltage corresponding to a properly loaded wafer is about 2.3 volts during a test period 402. For this example, a suitable threshold voltage for comparison at time $t_1$ might be about 2.0 volts. If the wafer is not properly loaded on the electrostatic chuck, then the capacitance between the workpiece and the electrostatic chuck will be higher and, as a result, workpiece presence signal 400 will be less than 2.0 volts at time $t_1$. Accordingly, if the capacitance sensor subsystem detects less than 2.0 volts at time $t_1$, then it will assume that the wafer is not properly loaded on the electrostatic chuck.

At or near time $t_C$, the DC clamping voltage is applied to the electrostatic chuck to clamp the wafer. In practice, the CVD system may perform a heating procedure between time $t_1$ and time $t_C$ to prepare the wafer for the CVD process. The rise in workpiece presence signal 400 at time $t_C$ corresponds to the activation of the DC clamping voltage. This condition (which is sometimes referred to as "hard clamping") is achieved when the wafer is electrostatically forced against the electrostatic chuck. The DC clamping voltage causes the wafer to flatten against the electrostatic chuck. Consequently, the capacitance between the wafer and the electrostatic chuck decreases and workpiece presence signal 400 increases. In FIG. 8, the detected voltage corresponding to a properly clamped wafer is about 3.0 volts during a test period 404. It may be desirable to check the sensed voltage at this time to confirm whether or not the wafer is properly clamped. For this example, a suitable threshold voltage for comparison at time $t_2$ might be about 2.7 volts. If the wafer is not properly clamped at this time, then the capacitance between the workpiece and the electrostatic chuck will be higher and, as a result, workpiece presence signal 400 will be less than 2.7 volts at time $t_2$. Accordingly, if the capacitance sensor subsystem detects less than about 2.7 volts at time $t_2$, then it will assume that the wafer is not properly clamped to the electrostatic chuck.

At or near time $t_{UC}$, the DC clamping voltage is removed from the electrostatic chuck to unclamp the wafer. During the time between time $t_C$ and time $t_{UC}$, the CVD system performs the CVD process on the wafer. Also during this time, the wafer may be subjected to a cooling procedure and/or a backside helium purge procedure following the CVD process. The drop in workpiece presence signal 400 at time $t_{UC}$ corresponds to the removal of the DC clamping voltage and any DC offset voltage and, in response, removal of the electrostatic adhesion force. Thus, the wafer is freed from the electrostatic chuck. Since the wafer need not be completely flat in its natural state, removal of the DC clamping force can result in the wafer "springing" back into its natural shape, which might cause the wafer to partially "float" above the surface of the electrostatic chuck. Consequently, the capacitance between the wafer and the electrostatic chuck increases and workpiece presence signal 400 decreases. In FIG. 8, the detected voltage corresponding to a properly unclamped wafer is about 1.7 volts during a test period 406. At or near time $t_3$, the capacitance sensor subsystem can check whether the wafer is in an unclamped state by comparing the voltage level of workpiece presence signal 400 to a specified threshold voltage. For this example, a suitable threshold voltage for comparison at time $t_3$ might be about 2.5 volts. If the wafer is not unclamped, then the capacitance between the workpiece and the electrostatic chuck will be lower and, as a result, workpiece presence signal 400 will be greater than 2.5 volts at time $t_3$. Accordingly, if the capacitance sensor subsystem detects more than 2.5 volts at time $t_3$, then it will assume that the wafer is still at least partially clamped to the electrostatic chuck.

For this particular example, the detected unclamped voltage after the process (1.7 volts) is lower than the unclamped voltage before the process (2.3 volts). This is due to the fact that wafers are not perfectly flat and as the wafer is clamped it will flatten. A clamped wafer will experience thermal stresses during processing and after the wafer is unclamped it will return to its original state. During this transition there is a period where the wafer oscillates giving the lower detected voltage (1.7 volts). The detected voltage will return to the higher value (2.3 volts) once the oscillation stops.

At or near time $t_L$, the lift pins are engaged to lift the wafer above the electrostatic chuck. The rise in workpiece presence signal 400 at time $t_L$ corresponds to the lifting of the wafer above the upper surface of the electrostatic chuck. Ideally, the wafer will be properly resting on the lift pins at this time. For this particular embodiment, the plasma serves as a good conductor between the workpiece and the electrostatic chuck. Consequently, the capacitance between the wafer and the electrostatic chuck decreases and workpiece presence signal 400 increases. In FIG. 8, the detected voltage corresponding to a properly lifted wafer is about 4.0 volts during a test period 408. At or near time $t_4$, the capacitance sensor subsystem can verify whether the wafer is properly or improperly resting on the lift pins by comparing the voltage level of workpiece presence signal 400 to a specified threshold voltage. For this example, a suitable threshold voltage for comparison at time $t_4$ might be about 3.8 volts. If the wafer is not properly resting on the lift pins, then the capacitance between the workpiece and the electrostatic chuck will be higher and, as a result, workpiece presence signal 400 will be less than 3.8 volts at time $t_4$. Accordingly, if the capacitance sensor subsystem detects less than 3.8 volts at time $t_4$, then it will assume that the wafer is not resting properly on the lift pins.

In practice, a CVD system as described herein may need to be calibrated to ensure that the various threshold voltages accurately reflect the expected trends in the workpiece presence signal. If the capacitive sensor subsystem is implemented in the clamping voltage power supply, then it may be desirable to calibrate the voltage thresholds whenever the clamping voltage power supply is replaced. Moreover, it may be necessary to calibrate the voltage thresholds for different electrostatic chuck configurations. Accordingly, the capacitive sensor subsystem may have multiple calibration settings for multiple electrostatic chuck types and/or multiple process sequences.

Figure 9:
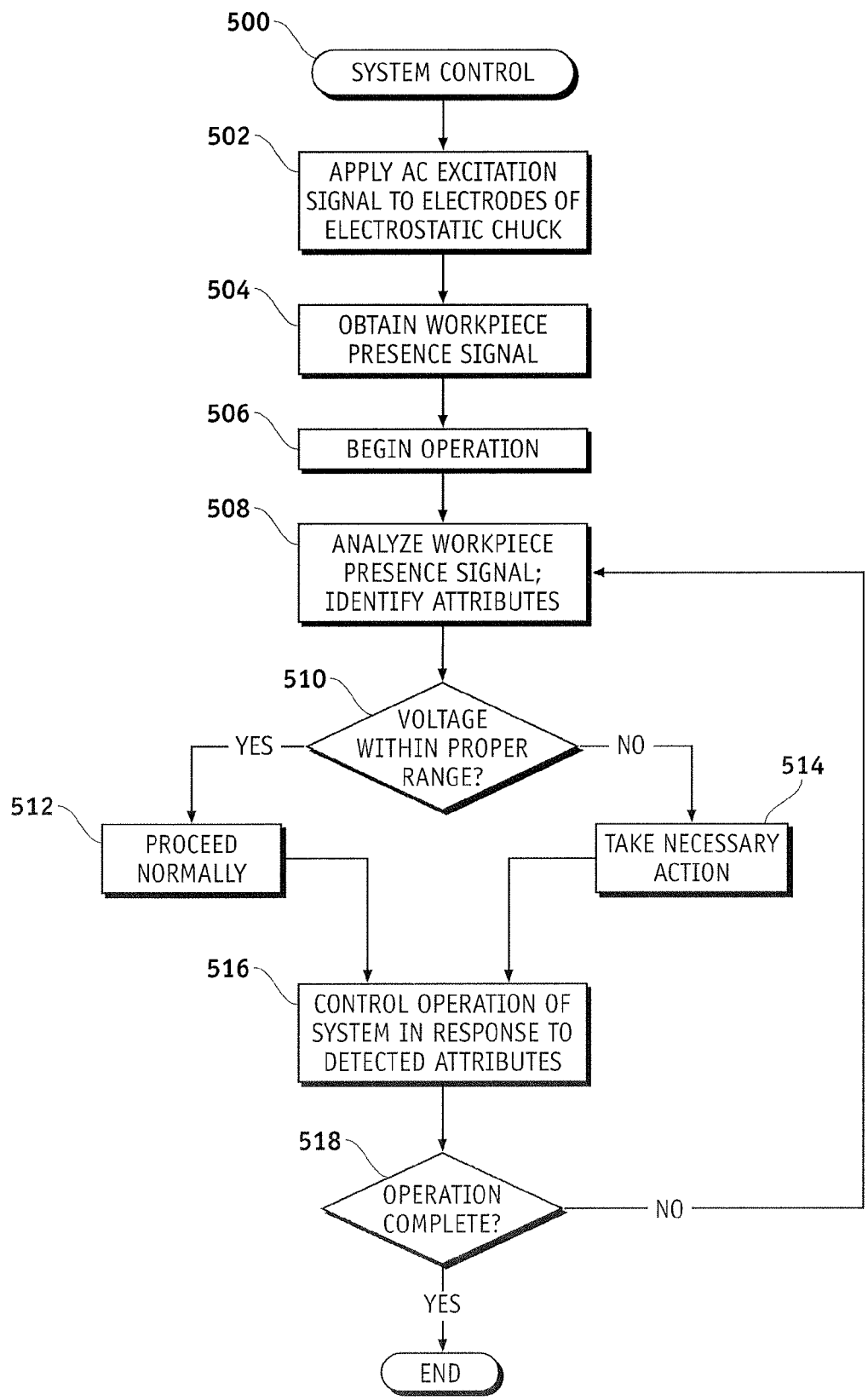
FIG. 9 is a flow chart that illustrates an embodiment of a method of controlling a semiconductor workpiece processing system.

The capacitive sensing techniques described herein can be utilized to monitor and/or control the operation of any semiconductor workpiece processing system that utilizes an electrostatic chuck. In this regard, FIG. 9 is a flow chart that illustrates an embodiment of a method 500 of controlling a semiconductor workpiece processing system. The various tasks performed in connection with method 500 may be performed by software, hardware, firmware, or any combination thereof. For illustrative purposes, the following description of method 500 may refer to elements mentioned above in connection with FIGS. 1-7. In practice, portions of method 500 may be performed by different elements of the described system, e.g., the electrostatic chuck, the clamping power supply, a processing component, or the like. It should be appreciated that method 500 may include any number of additional or alternative tasks, the tasks shown in FIG. 9 need not be performed in the illustrated order, and method 500 may be incorporated into a more comprehensive procedure or method having additional functionality not described in detail herein.

For purposes of this example, semiconductor workpiece processing system control method 500 begins by applying an AC excitation signal (task 502) to the electrodes of the electrostatic chuck of the host system. In addition, method 500 obtains a suitably formatted workpiece presence signal (task 504) in response to the AC excitation signal. As mentioned above, the workpiece presence signal is influenced by the capacitance between the workpiece and the electrostatic chuck, and certain electrical characteristics of the workpiece presence signal will vary with changes in the capacitance. This embodiment of method 500 then begins the processing operation (task 506) for a particular workpiece. Notably, the capacitive sensing technique described here is active before, during, and after the actual process that is performed by the semiconductor workpiece processing system.

System control method 500 can analyze the workpiece presence signal at appropriate times during operation of the system. In certain embodiments, method 500 analyzes the workpiece presence signal to identify (task 508) certain attributes of the workpiece presence signal, where such attributes are indicative of proper or improper positioning of the workpiece relative to the electrostatic chuck at different measurement times during operation of the system. As explained above with reference to FIG. 8, method 500 may compare the measured voltage of the workpiece presence signal to one or more threshold voltages and/or check whether the measured voltage of the workpiece presence signal is within a proper range for the particular measurement time. In this regard, query task 510 may represent a comparison of the sensed voltage to one or more calibrated threshold voltages associated with the measurement time. In practice, different threshold voltages can be used at different test times. As described above, the attribute identified during task 508 may be indicative of: proper/improper placement of the workpiece on the electrostatic chuck; a clamped/unclamped status of the workpiece; proper/improper placement of the workpiece on a plurality of lift pins; or other conditions.

If query task 510 determines that the measured sense voltage is within the proper range for that measurement time, then system control method 500 can proceed normally (task 512). Otherwise, method 500 may take any necessary action (task 514), such as corrective action, termination of the operation step, generation of warnings or alarms, or the like. For this embodiment, method 500 controls the operation of the host system in a manner that is dictated by the detected attribute or attributes (task 516). For example, if the attribute is indicative of proper initial placement of the workpiece on the electrostatic chuck, then task 516 may initiate electrostatic clamping of the workpiece. If, however, the attribute is indicative of improper placement of the workpiece on the electrostatic chuck, then task 516 may generate an appropriate warning indication, alarm, or message. Alternatively or additionally, task 516 may cause the semiconductor workpiece processing system to initiate reloading of the workpiece on the electrostatic chuck in an attempt to obtain proper placement. Alternatively or additionally, task 516 may terminate the operation step of the system if the detected attribute indicates improper placement of the workpiece on the electrostatic chuck. As another example, task 516 may generate indicia of the clamped or unclamped status of the workpiece. Referring to FIG. 8, this might occur at time $t_2$ (normally a clamped condition) or at time $t_3$ (normally an unclamped condition). If the clamping status of the workpiece is not as expected, then task 516 may cause the system to terminate the operation step, generate a warning, initiate a re-clamping procedure, or the like. As yet another example, task 516 may generate an appropriate warning message, signal, or alarm if the detected attribute is indicative of improper placement of the workpiece on the lift pins. Alternatively or additionally, task 516 may cause the semiconductor workpiece processing system to initiate reloading of the workpiece on the lift pins in an attempt to obtain proper placement. Alternatively or additionally, task 516 may terminate the operation step of the system if the detected attribute indicates improper placement of the workpiece on the lift pins. This type of corrective action may be desirable to prevent damage to the workpiece and/or to the system itself.

If the operation is complete (query task 518), then system control method 500 ends or is repeated for the next workpiece. If the operation is not complete, then method 500 may return to task 508 to continue monitoring for other detectable attributes and to continue operating the semiconductor workpiece processing system in an appropriate manner as described above.

A capacitive sensor subsystem as described herein can also be configured and controlled to perform a self-clamp recovery procedure on a workpiece during a semiconductor process operation. Self clamping is a problem condition that can occur if, during processing, the wafer separates from the electrostatic chuck (this can be caused by the backside helium pressure applied to the wafer, for example). Such separation of the wafer exposes the surface of the electrostatic chuck to the plasma, which can cause ionic charge to accumulate on the surface of the chuck. If the surface of the chuck is exposed to the plasma while clamping voltage is applied, the surface of the chuck collects ions (charge). Consequently, even after the DC clamping voltage is removed from the electrostatic chuck, the residual charge collected on the surface of the chuck attracts the wafer, resulting in partial electrostatic clamping to the chuck. This condition can be problematic because most systems ordinarily expect the wafer to be free of the electrostatic chuck after the clamping voltage is removed, when in reality it remains clamped.

Referring again to FIG. 8, the check performed at time $t_3$ verifies whether or not the workpiece is unclamped (as it should be under normal operating conditions). If residual self-clamping has occurred during the process, then the sense voltage detected at time $t_3$ will be higher than the comparison threshold voltage. In other words, the capacitive sensor subsystem will indicate that the workpiece is not in the desired unclamped state. At this time, certain system embodiments can initiate a self-clamp recovery procedure in an attempt to release the workpiece from the electrostatic chuck before proceeding further.

For this particular embodiment, the self-clamp recovery procedure searches for a "release" voltage that (when applied to the electrostatic chuck) releases the self-clamped wafer. In other words, the recovery procedure determines a compensating DC voltage that counteracts and nullifies the accumulated residual charge on the surface of the electrostatic chuck. This is accomplished by applying different clamping voltages to the electrostatic chuck while simultaneously monitoring the workpiece presence signal (obtained by a capacitive sensor subsystem, as described above). As different DC voltages are applied, certain voltages or voltage ranges will release the workpiece from the electrostatic chuck, notwithstanding the accumulated residual charge. By monitoring and detecting certain attributes of the workpiece presence signal (in the manner described above), the capacitive sensor subsystem can detect when the workpiece becomes unclamped and record or save the corresponding DC voltage that results in unclamping. This allows the semiconductor workpiece processing system to unclamp the workpiece by applying the appropriate DC voltage to the electrostatic chuck. After the workpiece is verified to be unclamped, the process operation may proceed as usual or it may initiate corrective action to remove the residual charge and then proceed as needed.

Figure 10:
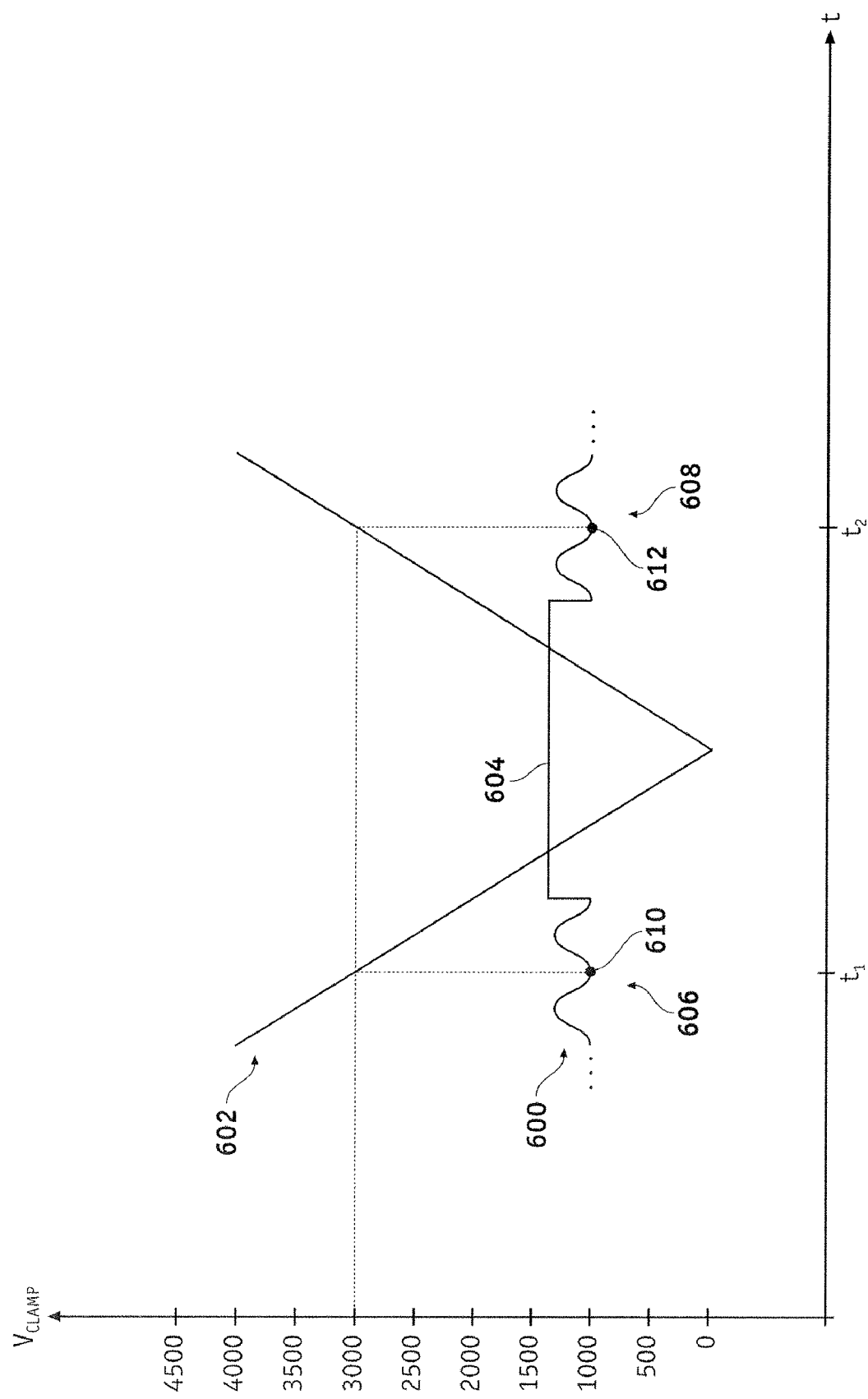
FIG. 10 is a graph of an exemplary workpiece presence signal obtained from a capacitance sensor subsystem of a semiconductor workpiece processing system during a self-clamp recovery procedure.

FIG. 10 graphically illustrates an exemplary self-clamp recovery procedure. FIG. 10 is a graph of an exemplary workpiece presence signal 600 obtained from a capacitance sensor subsystem of a CVD system during a self-clamp recovery procedure. FIG. 10 also includes a voltage scan plot 602 (which is V-shaped in this example) that represents the DC voltage that is applied to the electrostatic chuck during the self-clamp recovery procedure. For this example, the vertical scale represents the DC voltage potential applied across two electrodes of the electrostatic chuck. For ease of description and illustration, no vertical scale is depicted for workpiece presence signal 600.

The relatively flat region 604 of workpiece presence signal 600 represents a clamped state, where residual self-clamping charge (combined with the applied DC voltage) clamps the workpiece to the electrostatic chuck. In contrast, the lower extremes of workpiece presence signal 600 indicate an unclamped state, where the applied DC voltage counteracts the residual charge. For this example, the capacitive sensor subsystem is suitably configured to detect at least one local minimum in workpiece presence signal 600, where the local minimum is flanked by two local maxima. FIG. 10 depicts two of these local minima, which occur in two M-shaped regions 606/608. The local minimum point 610 is indicative of a first unclamped state, and the local minimum point 612 is indicative of a second unclamped state.

In operation, the DC voltage applied to the electrostatic chuck is varied while workpiece presence signal 600 is monitored to detect the occurrence of local minimum points 610/612. In practice, the same DC offset voltage is used for workpiece processing and for the self-clamp recovery procedure. The example of FIG. 10 varies the DC voltage from a maximum value of about 4000 volts, to a minimum value of about zero volts, and back to the maximum value. Other embodiments can scan the DC voltage values in different ways. At or near time $t_1$, an applied DC voltage of about 3000 volts results in the first unclamped state corresponding to local minimum point 610. For comparison, under normal conditions where self-clamping has not occurred, an unclamped state is obtained when the DC voltage applied to the electrostatic chuck is at or near zero volts. Likewise, at or near time $t_2$, an applied DC voltage of about 3000 volts results in the second unclamped state corresponding to local minimum point 612. This redundant check, while not required, is desirable to ensure that the proper self-clamp recovery voltage is found.

The capacitive sensor subsystem can then record the voltage or voltages that resulted in the unclamped condition (3000 volts in this example). This voltage is then applied to the electrostatic chuck to release the workpiece. Application of the self-clamp recovery voltage should result in an unclamped condition that can be verified in the manner described above in connection with FIG. 8.

The subject matter and embodiments described here may be implemented in any semiconductor workpiece processing reactor utilizing an electrostatic chuck. Such a reactor may perform different deposition or etch/strip process and take many different forms. Generally, the apparatus will include one or more reaction chambers (sometimes including multiple stations) that house one or more wafers and are suitable for wafer processing. The one or more chambers maintain the wafer in a defined position or positions (with or without motion within that position, e.g., rotation, vibration, or other agitation). While in process, each wafer is held in place by an electrostatic chuck and other wafer holding apparatus. Examples of suitable reactors are the SPEED HDP-CVD reactor, PDL™ silicon oxide reactor, and INOVA™ PVD reactor, all available from Novellus Systems, Inc. of San Jose, Calif.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electrostatic chuck assembly comprising:
a platen configured to receive a workpiece;
a clamping voltage power supply configured to generate a direct current (DC) clamping voltage for the electrostatic chuck assembly;
an electrode assembly for the platen, the electrode assembly being configured to receive the DC clamping voltage to electrostatically adhere the workpiece to the platen; and
a capacitive sensor subsystem coupled to the electrode assembly, the capacitive sensor subsystem being configured to generate an alternating current (AC) excitation signal for the electrode assembly, and analyze electrical characteristics of the excitation signal that are influenced by changes in capacitance between the workpiece and the platen; wherein
the clamping voltage power supply comprises the capacitive sensor subsystem; and
the clamping voltage power supply further comprises an adjustable DC offset voltage source configured to generate a DC offset potential for the electrode assembly.

2. The electrostatic chuck assembly of claim 1, the capacitive sensor subsystem comprising an AC voltage generator configured to generate the AC excitation signal.

3. The electrostatic chuck assembly of claim 2, wherein the AC voltage generator is configured to impress the AC excitation signal onto the DC clamping voltage.

4. The electrostatic chuck assembly of claim 1, the capacitive sensor subsystem comprising a processing architecture configured to detect a workpiece status attribute of the excitation signal.

5. The electrostatic chuck assembly of claim 4, the processing architecture being further configured to control operation of a host workpiece processing system in response to the detected workpiece status attribute.

6. The electrostatic chuck assembly of claim 4, wherein the workpiece status attribute indicates whether the workpiece is properly positioned on the platen.

7. The electrostatic chuck assembly of claim 4, wherein the workpiece status attribute indicates whether the workpiece is properly clamped to the platen.

8. The electrostatic chuck assembly of claim 4, wherein:
the electrostatic chuck assembly further comprises a plurality of lift pins configured to lift the workpiece above the platen; and
the workpiece status attribute indicates whether the workpiece is resting properly on the plurality of lift pins.

9. The electrostatic chuck assembly of claim 1, wherein:
the workpiece comprises a semiconductor wafer; and
the electrostatic chuck assembly is incorporated into one of a deposition, etch, or strip system.

10. The electrostatic chuck assembly of claim 9, wherein the deposition system is a chemical vapor deposition system.

11. The electrostatic chuck assembly of claim 10, wherein the deposition system is a high density plasma chemical vapor deposition system.

12. A method of controlling a semiconductor workpiece processing system that processes a workpiece, the system having an electrostatic chuck that holds the workpiece during processing, the method comprising:
before performing workpiece processing on the workpiece, applying an alternating current (AC) excitation signal to electrodes of the electrostatic chuck;
before performing workpiece processing on the workpiece, obtaining a workpiece presence signal in response to the AC excitation signal, the workpiece presence signal being influenced by capacitance between the electrostatic chuck and the workpiece;
before performing workpiece processing on the workpiece, identifying an attribute of the workpiece presence signal;
generating a warning indication, before performing workpiece processing on the workpiece, if the attribute is indicative of improper placement of the workpiece on the electrostatic chuck; and
thereafter, applying a constant DC clamping voltage to the electrostatic chuck while performing workpiece processing on the workpiece.

13. The method of claim 12, further comprising initiating reloading of the workpiece on the electrostatic chuck if the attribute is indicative of improper placement of the workpiece on the electrostatic chuck.

14. The method of claim 12, further comprising terminating an operating step of the system if the attribute is indicative of improper placement of the workpiece on the electrostatic chuck.

15. The method of claim 12, wherein the attribute is indicative of a clamped/unclamped status of the workpiece on the electrostatic chuck.

16. The method of claim 15, further comprising generating indicia of the clamped/unclamped status.

17. The method of claim 12, wherein:
the electrostatic chuck cooperates with a plurality of lift pins; and
the attribute is indicative of proper/improper placement of the workpiece on the plurality of lift pins.

18. The method of claim 17, further comprising generating a warning indication if the attribute is indicative of improper placement of the workpiece on the plurality of lift pins.

19. The method of claim 17, further comprising initiating reloading of the workpiece on the plurality of lift pins if the attribute is indicative of improper placement of the workpiece on the plurality of lift pins.

20. The method of claim 17, further comprising terminating an operating step of the system if the attribute is indicative of improper placement of the workpiece on the plurality of lift pins.

21. The method of claim 12, wherein:
obtaining the workpiece presence signal occurs at a measurement time;
identifying an attribute of the workpiece presence signal comprises identifying a measured voltage of the workpiece presence signal at the measurement time; and
the method further comprises comparing the measured voltage to a threshold voltage associated with the measurement time.

22. The method of claim 12, wherein the semiconductor workpiece processing system is a chemical vapor deposition system.

23. The method of claim 22, wherein the deposition system is a high density plasma chemical vapor deposition system.

24. A semiconductor workpiece processing system comprising:

an electrostatic chuck configured to receive a workpiece, the electrostatic chuck comprising a clamping electrode assembly; and a clamping voltage power supply coupled to the clamping electrode assembly, the clamping voltage power supply comprising:

a direct current (DC) voltage generator configured to generate a DC clamping voltage for the clamping electrode assembly;

an adjustable DC offset voltage source configured to generate a DC offset potential for the clamping electrode assembly;

an alternating current (AC) voltage generator configured to generate an AC excitation signal for the clamping electrode assembly; and a processing architecture coupled to the clamping electrode assembly, and configured to analyze attributes of a workpiece presence signal obtained in response to the AC excitation signal, and, based on the attributes, verify proper/improper positioning of the workpiece relative to the electrostatic chuck before and after performing workpiece processing on the workpiece, wherein the clamping voltage power supply applies a constant DC clamping voltage to the electrostatic chuck while the semiconductor workpiece processing system performs workpiece processing on the workpiece.

25. The system of claim 24, wherein the processing architecture is configured to verify proper/improper loading of the workpiece on the electrostatic chuck before the semiconductor workpiece processing system performs workpiece processing on the workpiece.

26. The system of claim 24, wherein the processing architecture is configured to verify proper/improper clamping of the workpiece to the electrostatic chuck before the semiconductor workpiece processing system performs workpiece processing on the workpiece.

27. The system of claim 24, further comprising a plurality of lift pins that cooperate with the electrostatic chuck, wherein the processing architecture is configured to verify proper/improper placement of the workpiece on the plurality of lift pins before the semiconductor workpiece processing system performs workpiece processing on the workpiece.

28. The system of claim 24, wherein electrical characteristics of the workpiece presence signal are influenced by changes in capacitance between the workpiece and the electrostatic chuck.

29. The system of claim 24, wherein the semiconductor workpiece processing system is a chemical vapor deposition system.

30. The method of claim 24, wherein the deposition system is a high density plasma chemical vapor deposition system.

* * * * *